United States Patent
Kobayashi

(10) Patent No.: US 12,082,455 B2
(45) Date of Patent: Sep. 3, 2024

(54) DISPLAY DEVICE

(71) Applicant: SHARP KABUSHIKI KAISHA, Sakai (JP)

(72) Inventor: Fumiyuki Kobayashi, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 0 days.

(21) Appl. No.: 18/266,275

(22) PCT Filed: Dec. 11, 2020

(86) PCT No.: PCT/JP2020/046314
§ 371 (c)(1),
(2) Date: Jun. 9, 2023

(87) PCT Pub. No.: WO2022/123776
PCT Pub. Date: Jun. 16, 2022

(65) Prior Publication Data
US 2024/0049527 A1    Feb. 8, 2024

(51) Int. Cl.
| H10K 59/126 | (2023.01) |
| G09G 3/3233 | (2016.01) |
| H10K 59/131 | (2023.01) |

(52) U.S. Cl.
CPC ......... *H10K 59/126* (2023.02); *G09G 3/3233* (2013.01); *H10K 59/131* (2023.02); *G09G 2300/0426* (2013.01); *G09G 2300/0842* (2013.01); *G09G 2300/0861* (2013.01); *G09G 2310/08* (2013.01); *G09G 2320/0247* (2013.01)

(58) Field of Classification Search
CPC ......... G09G 3/3233; G09G 2300/0861; G09G 2310/08; G09G 2300/0426; G09G 2300/0842; G09G 2320/0247; H10K 59/126; H10K 59/131; H10K 59/1213; G09F 9/30; H05B 33/02
See application file for complete search history.

(56) References Cited

U.S. PATENT DOCUMENTS

| 2002/0140645 | A1* | 10/2002 | Sato | G09G 3/3233 345/82 |
| 2013/0057512 | A1* | 3/2013 | Lillie | G06F 3/0412 345/174 |
| 2016/0247452 | A1* | 8/2016 | Lee | H10K 59/131 |
| 2017/0004757 | A1* | 1/2017 | Yata | G09G 3/2003 |
| 2017/0294503 | A1* | 10/2017 | Kim | H10K 59/1213 |
| 2018/0130416 | A1 | 5/2018 | Murakami et al. | |
| 2020/0027939 | A1* | 1/2020 | Cho | H10K 59/126 |

FOREIGN PATENT DOCUMENTS

| JP | 2003-271076 A | 9/2003 |
| JP | 2018-072780 A | 5/2018 |
| JP | 2018-136565 A | 8/2018 |

* cited by examiner

Primary Examiner — Shaheda A Abdin
(74) Attorney, Agent, or Firm — ScienBiziP, P.C.

(57) ABSTRACT

A display includes: a light-emitting element; a first data signal line to which a signal corresponding to video data is supplied in a vertical scanning period and a signal not corresponding to video data is supplied in an update pause period; a drive transistor configured to control a current value of the light-emitting element; and a conductor electrically connected to a gate electrode of the drive transistor; a shield electrode located between the first data signal line and the conductor and adjacent to each of the first data signal line and the conductor in a plan view.

12 Claims, 10 Drawing Sheets

(a)

(b)

DISPLAY DEVICE

TECHNICAL FIELD

The disclosure relates to a display device.

BACKGROUND ART

PTL 1 discloses a display device including a light-emitting element, the display device having a mode in which refreshing (update of display data) is performed at a high frequency and a mode in which refreshing is performed at a low frequency (low-frequency driving).

CITATION LIST

Patent Literature

PTL 1: JP 2018-72780 A

SUMMARY

Technical Problem

In such low-frequency driving, a luminance difference is generated between a frame period in which refreshing is performed and a frame period in which refreshing is not performed, which may be visually recognized as flicker (flickering of a screen).

Solution to Problem

A display device according to an aspect of the disclosure includes: a light-emitting element; a first data signal line to which a signal corresponding to video data is supplied in a vertical scanning period and a signal not corresponding to video data is supplied in an update pause period; a drive transistor configured to control a current value of the light-emitting element; a conductor electrically connected to a gate electrode of the drive transistor; and a shield electrode located between the first data signal line and the conductor and adjacent to each of the first data signal line and the conductor in a plan view.

Advantageous Effects of Disclosure

According to the aspect of the disclosure, it is possible to suppress flicker of a display device that performs low-frequency driving.

DESCRIPTION OF EMBODIMENTS

Figure 1:
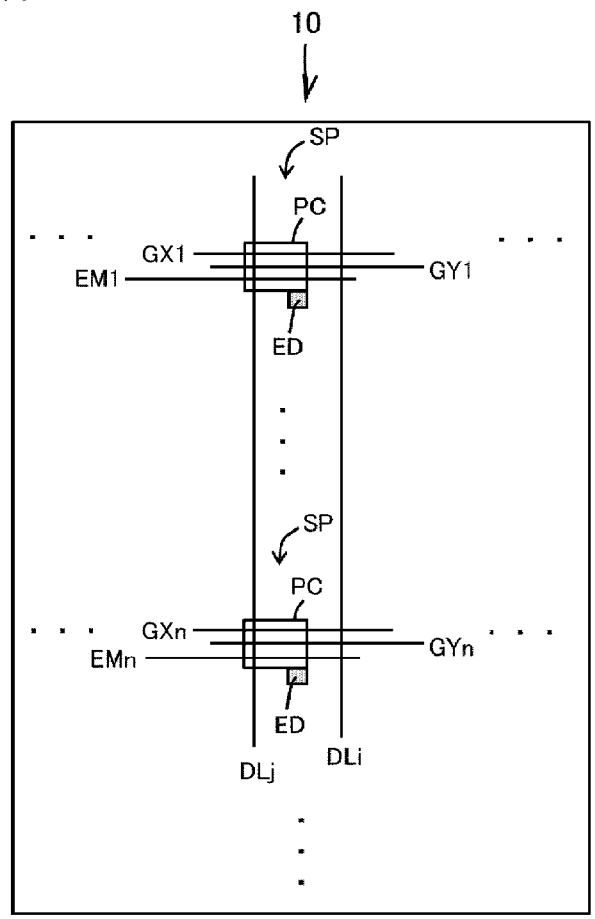
FIG. 1(a) is a schematic plan view illustrating a configuration of a display device according to a present embodiment.
FIG. 1(b) is a schematic cross-sectional view illustrating the configuration of the display device according to the present embodiment.
Figure 1:
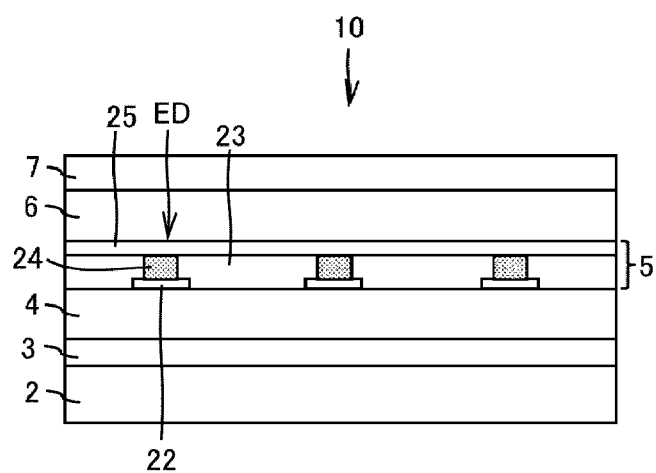

FIG. 1(a) is a schematic plan view illustrating a configuration of a display device according to a present embodiment, and FIG. 1(b) is a schematic cross-sectional view illustrating the configuration of the display device according to the present embodiment. As illustrated in FIG. 1, a display device 10 includes a plurality of subpixels SP each including a light-emitting element ED and a pixel circuit PC that controls the light-emitting element ED, and performs low-frequency driving at a refresh frequency lower than 60 Hz (described below), for example. The pixel circuit PC is connected to a plurality of signal lines such as data signal lines DLi and DLj, scanning signal lines GXn and GYn, and a light emission control signal line EMn.

In the display device 10, a barrier layer 3, a thin film transistor layer (TFT layer) 4 including the pixel circuit PC, a light-emitting element layer 5 including the light-emitting element ED, a sealing layer 6, and a function layer 7 are provided in this order on a substrate 2.

The substrate 2 is a glass substrate or a flexible substrate including resin such as polyimide as a main component, and for example, the substrate 2 may be constituted by two layers of polyimide films and an inorganic film interposed therebetween. The barrier layer 3 can be constituted by an inorganic insulating layer that prevents penetration of foreign matters such as water and oxygen. The pixel circuit PC that controls the light-emitting element ED is formed in the TFT layer 4 (described below).

The light-emitting element layer 5 includes a lower electrode 22, an edge cover film 23 having insulating properties and covering an edge of the lower electrode 22, an electroluminescence (EL) layer 24 provided at an upper layer compared to the edge cover film 23, and an upper electrode 25 at an upper layer compared to the EL layer 24. The edge cover film 23 is formed by applying an organic material such as polyimide or acrylic resin and then patterning the organic material by photolithography, for example.

The light-emitting element layer 5 is formed with a plurality of the light-emitting elements ED having different luminescent colors, and each light-emitting element includes the lower electrode 22 having an island shape, the EL layer 24 including a light-emitting layer, and the upper electrode 25. The upper electrode 25 is a common electrode that has a solid-like shape and that is common among the plurality of light-emitting elements ED.

The light-emitting element ED may be, for example, an organic light-emitting diode (OLED) including an organic layer as a light-emitting layer, or may be a quantum dot light emitting diode (QLED) including a quantum dot layer as a light-emitting layer.

For example, the EL layer 24 is formed by layering a hole injection layer, a hole transport layer, a light-emitting layer, an electron transport layer, and an electron injection layer in this order, from the lower layer side. The light-emitting layer is formed into an island shape at an opening of the edge cover film 23 (on a subpixel-by-subpixel basis) by a vapor deposition method, an ink-jet method, or a photolithography method. Other layers are formed in an island shape or a solid-like shape (common layer). A configuration can also be adopted in which one or more layers are not formed among the hole injection layer, the hole transport layer, the electron transport layer, and the electron injection layer.

The lower electrode (anode) 22 is a light-reflecting electrode formed by layering indium tin oxide (ITO) and silver (Ag) or an alloy containing Ag, for example. The upper electrode (cathode) 25 is constituted by a metal thin film made of, for example, a magnesium silver alloy or the like, and has optical transparency.

In a case where the light-emitting element ED is an OLED, positive holes and electrons recombine inside the light-emitting layer in response to a drive current between the lower electrode 22 and the upper electrode 25, and light is emitted when excitons generated in this manner are shifted to a ground state. In a case where the light-emitting element ED is a QLED, positive holes and electrons recombine inside the light-emitting layer in response to a drive current between the lower electrode 22 and the upper electrode 25, and light is emitted when excitons generated in this manner are shifted from a conduction band of a quantum dot to a valence band.

The sealing layer 6 covering the light-emitting element layer 5 is a layer that prevents penetration of foreign matter such as water or oxygen into the light-emitting element layer 5, and for example, the sealing layer 6 can include two inorganic sealing films and an organic film formed therebetween. The function layer 7 is a layer having various functions such as optical control, a touch sensor, and surface protection.

Figure 2:
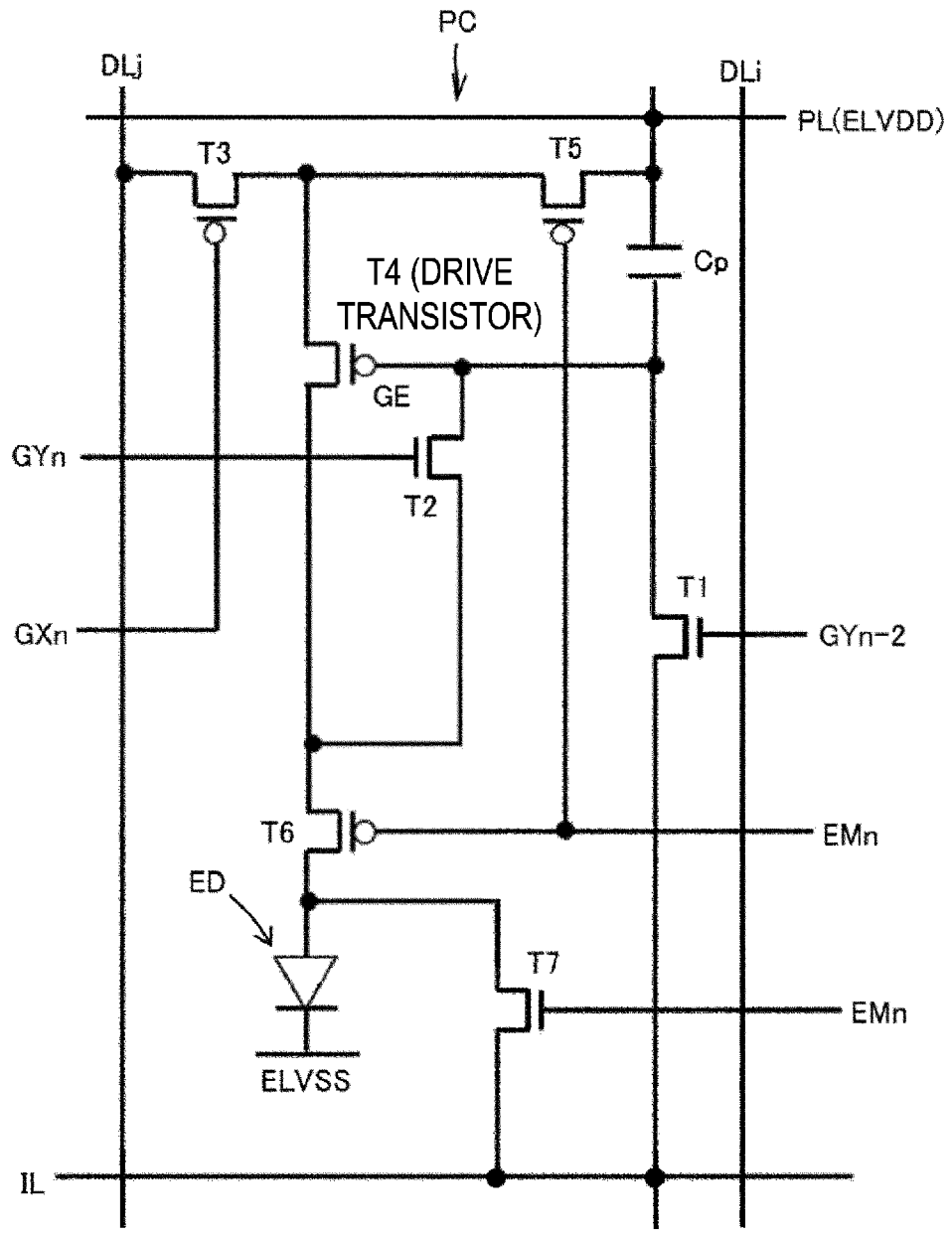
FIG. 2 is a circuit diagram illustrating a pixel circuit according to the present embodiment.

FIG. 2 is a circuit diagram illustrating the pixel circuit according to the present embodiment. The pixel circuit PC includes a pixel capacitance Cp, a transistor T1 whose gate electrode is connected to a scanning signal line GYn-2 of a second preceding stage (n−2 stage), a transistor T2 (set transistor) whose gate electrode is connected to the scanning signal line GYn of a current stage (n stage), a transistor T3 (write transistor) whose gate electrode is connected to the scanning signal line GXn of the current stage (n stage), a transistor T4 (drive transistor) that controls a current value of the light-emitting element ED, a transistor T5 whose gate electrode is connected to the light emission control signal line EMn of the current stage (n stage), a transistor T6 whose gate electrode is connected to the light emission control signal line EMn, and an initialization transistor T7 whose gate electrode is connected to the light emission control signal line EMn.

A gate electrode GE of the transistor T4 is connected to a power supply line PL via the pixel capacitance Cp, and is connected to an initialization signal line IL via the transistor T1. The power supply line PL is supplied with a high voltage side power supply (ELVDD), and the initialization signal line IL and a cathode (upper electrode 25) of the light-emitting element ED are supplied with, for example, a low voltage side power supply (ELVSS).

A source electrode of the transistor T4 is connected to the data signal line DLj via the transistor T3, and is connected to the power supply line PL via the transistor T5. A drain electrode of the transistor T4 is connected to an anode (lower electrode 22) of the light-emitting element ED via the transistor T6, and is connected to the gate electrode GE of the transistor T4 via the transistor T2. The anode of the light-emitting element ED is connected to the initialization signal line IL via the transistor T7.

First Embodiment

Figure 3:
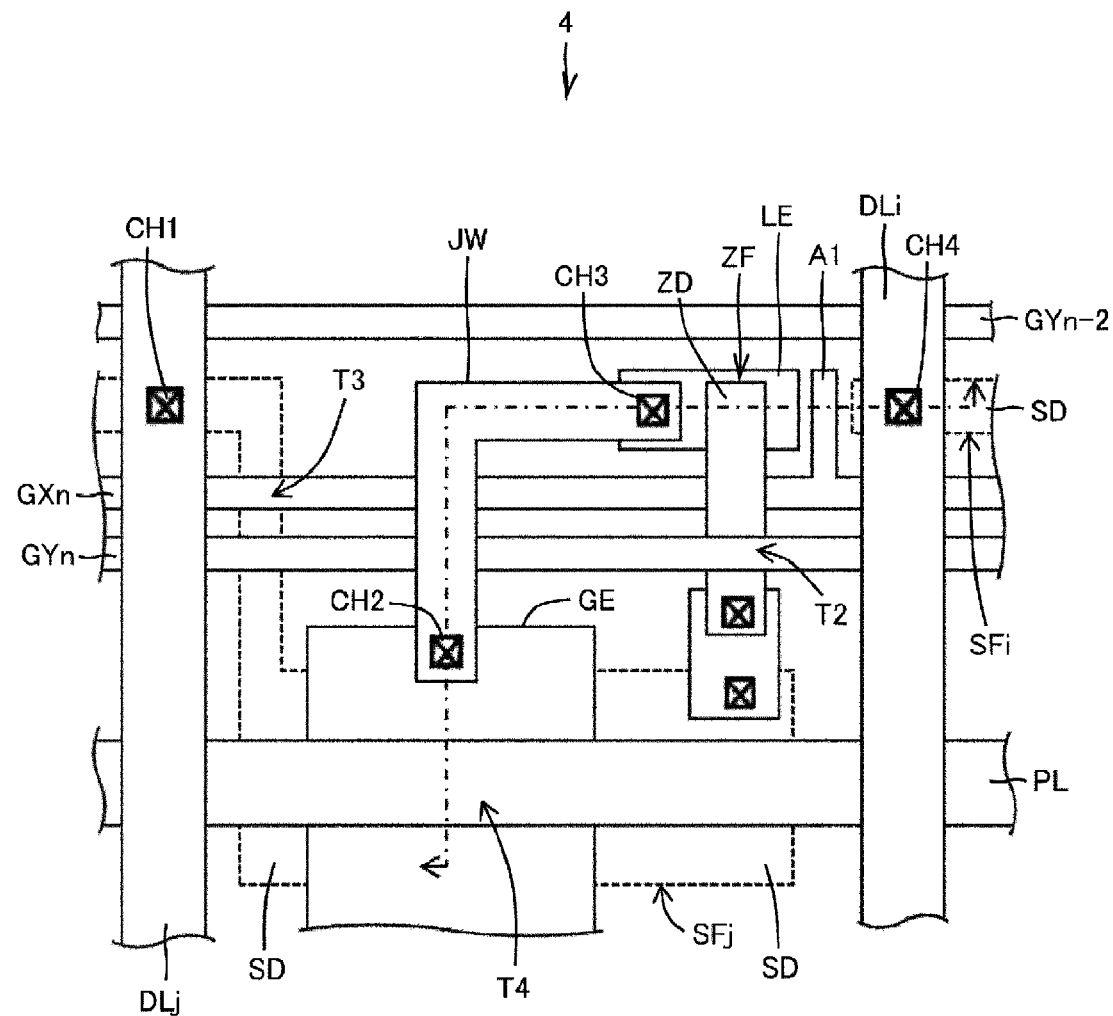
FIG. 3 is a plan view illustrating a configuration of a TFT layer according to a first embodiment.
Figure 4:
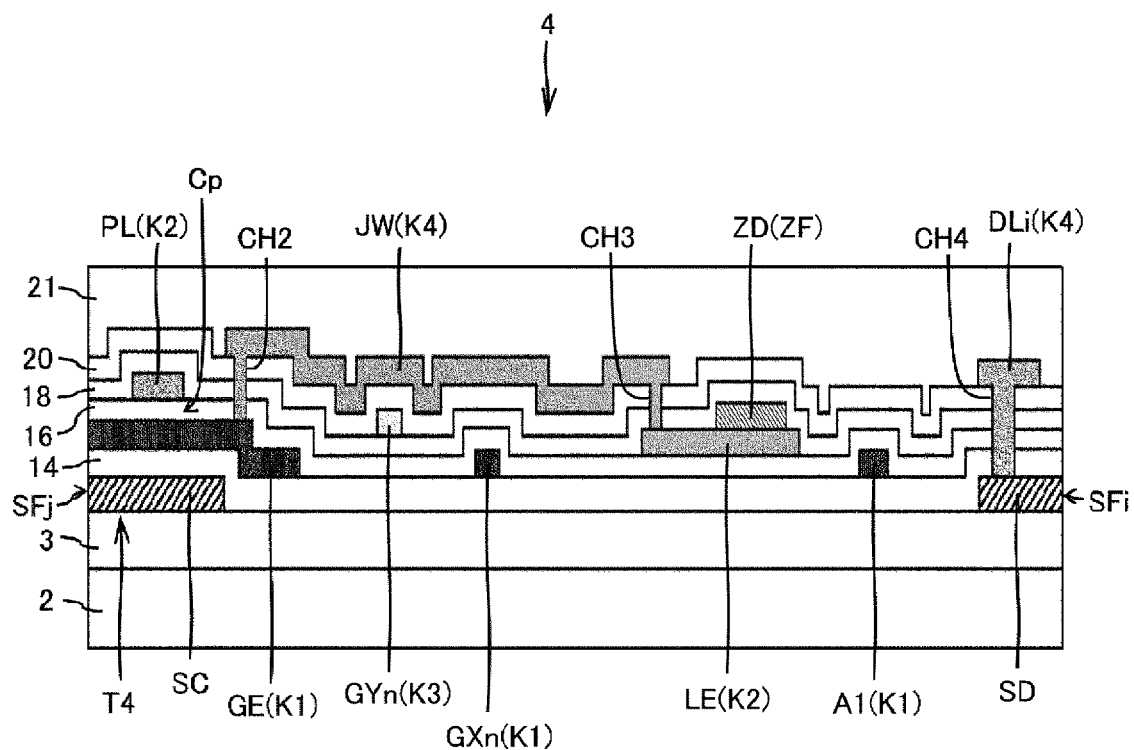
FIG. 4 is a cross-sectional view taken along an arrow in FIG. 3.
Figure 5:
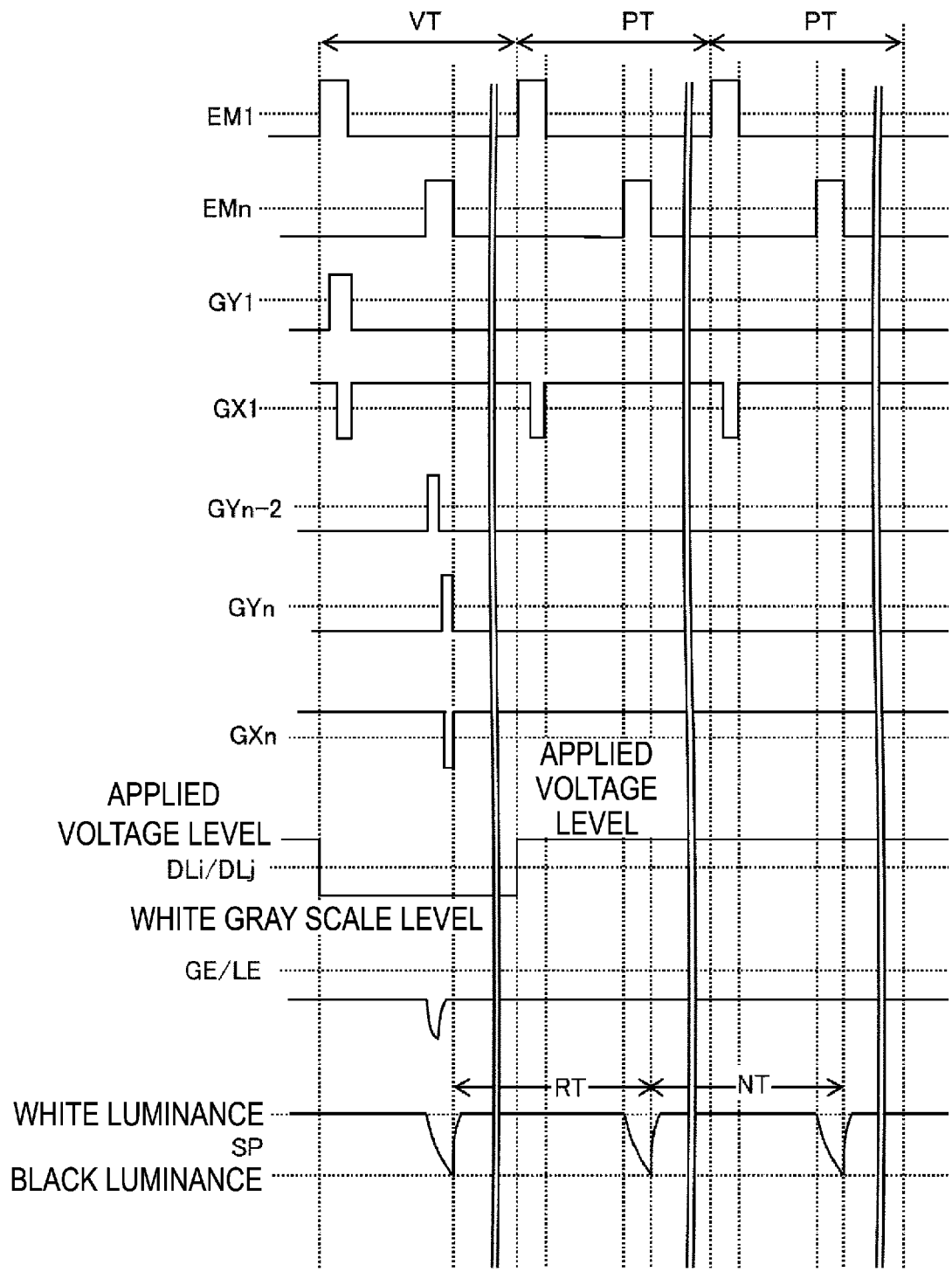
FIG. 5 is a timing chart illustrating actions of the display device according to the present embodiment.

FIG. 3 is a plan view illustrating a configuration of a TFT layer according to a first embodiment. FIG. 4 is a cross-sectional view taken along an arrow in FIG. 3. FIG. 5 is a timing chart illustrating actions of the display device according to the present embodiment.

As illustrated in FIGS. 3 and 4, the TFT layer 4 includes silicon films SFi and SFj formed on the barrier layer 3, an inorganic insulating film 14 (first gate insulating film) covering the silicon films SFi and SFj, a first metal layer K1 formed at an upper layer compared to the inorganic insulating film 14 and including the scanning signal line GXn and the gate electrode GE of the transistor T4, an inorganic insulating film 16 covering the first metal layer K1, a second metal layer K2 formed at an upper layer compared to the inorganic insulating film 16 and including the power supply line PL, an oxide semiconductor film ZF formed at an upper layer compared to the second metal layer K2, an inorganic insulating film 18 (second gate insulating film) covering the oxide semiconductor film ZF, a third metal layer K3 formed at an upper layer compared to the inorganic insulating film 18 and including the scanning signal lines GYn and GYn-2, an inorganic insulating film 20 covering the third metal layer K3, a fourth metal layer K4 formed at an upper layer compared to the inorganic insulating film 20 and including the data signal lines DLi and DLj and a source wiring line JW, and a flattening film 21 covering the fourth metal layer K4.

The silicon films SFi and SFj are formed of, for example, low-temperature polysilicon (LTPS). The silicon film SFi includes a conductor portion SD that functions as a conductor by being subjected to impurity doping or the like. The silicon film SFj includes a channel portion SC (overlapping portion with the first metal layer K1) that functions as a semiconductor, and a conductor portion SD that functions as a conductor by being subjected to impurity doping or the like.

The oxide semiconductor film ZF includes a compound including at least one type of element selected from, for example, indium (In), gallium (Ga), tin (Sn), hafnium (Hf), zirconium (Zr), and zinc (Zn), and oxygen (as an example, InGaZnO). The oxide semiconductor film ZF includes a channel portion (overlapping portion with the third metal layer K3) that functions as a semiconductor and a conductor portion ZD that functions as a conductor.

The first metal layer K1, the second metal layer K2, the third metal layer K3, and the fourth metal layer K4 are each formed of a metal single layer film or a metal multilayer film including at least one of aluminum, tungsten, molybdenum, tantalum, chromium, titanium, and copper, for example.

The inorganic insulating films 14, 16, 18, and 20 may be formed, for example, of a single layer film of silicon oxide (SiOx) or silicon nitride (SiNx), or a layered film of these. The flattening film 21 can be formed of, for example, a coatable organic material such as polyimide or acrylic resin.

As illustrated in FIGS. 2 to 5, the TFT layer 4 according to the first embodiment includes the data signal line DLi (first data signal line) to which a signal corresponding to video data (white gray scale level in FIG. 5) is supplied in a vertical scanning period VT and a constant potential signal not corresponding to video data (applied voltage level in FIG. 5) is supplied in an update pause period PT, the transistor T4 (drive transistor) that controls the current value of the light-emitting element ED, a conductor LE (relay electrode) electrically connected to the gate electrode GE of the transistor T4, and a shield electrode A1 located between the data signal line DLi and the conductor LE and adjacent to the data signal line DLi and the conductor LE in a plan view. The conductor LE is included in the second metal layer K2, and the shield electrode is included in the first metal layer K1.

The transistor T4 includes the channel portion SC (overlapping portion with the gate electrode GE) of the silicon film SFj, and the pixel capacitance Cp is formed between the gate electrode GE and the power supply line PL. The gate electrode GE is connected to the source wiring line JW through a contact hole CH2, and the source wiring line JW is connected to the conductor LE through a contact hole CH3. The conductor portion ZD of the oxide semiconductor film ZF is provided to be in contact with the conductor LE.

The first data signal line DLi and the conductor portion SD of the silicon film SFi are connected through a contact hole CH4 penetrating the inorganic insulating films 14, 16, 18, and 20, and the shield electrode A1 is located between the contact hole CH4 and the conductor LE in a plan view.

The TFT layer 4 includes the data signal line DLj (second data signal line) to which a signal corresponding to video data (white gray scale level in FIG. 5) is supplied in the vertical scanning period VT and a constant potential signal not corresponding to video data (applied voltage level in FIG. 5) is supplied in the update pause period PT, the transistor T3 (write transistor) whose gate electrode is connected to the scanning signal line GXn, and the transistor T2 (set transistor) whose gate electrode is connected to the scanning signal line GYn.

The source electrode (conductor portion SD of the silicon film SFj) of the transistor T4 is connected to the second data signal line DLj via the transistor T3. The gate electrode GE of the transistor T4 is connected to the drain electrode (conductor portion SD of the silicon film SFj) of the transistor T4 via the transistor T2.

As illustrated in FIG. 5, the scanning signal line GXn is selected (becomes active Low) in each of the vertical scanning period VT and the update pause period PT, and the scanning signal line GYn is selected (becomes active High) in the vertical scanning period VT while it is not selected during the update pause period PT. The light emission control signal line EMn becomes active High (in a lights-out state) while at least one of the scanning signal lines GXn and GYn is selected. The length of each of the vertical scanning period VT and the update pause period PT is, for example, 1/60 seconds.

In the first embodiment, the shield electrode A1 extending from the scanning signal line GXn suppresses electrical field formation (capacitive coupling) between the data signal line DLi and the conductor LE. Thus, a potential of the conductor LE (and the gate electrode GE) is less likely to vary at timing of switching between the vertical scanning period VT and the update pause period PT (for example, timing at which the potential of the data signal line DLi shifts from the white gray scale level to the applied voltage level). This reduces a luminance difference between a refresh frame period RT and a non-refresh frame period NT in the subpixel SP, as illustrated in FIG. 5. This can suppress flicker (flickering of the screen).

Figure 6:
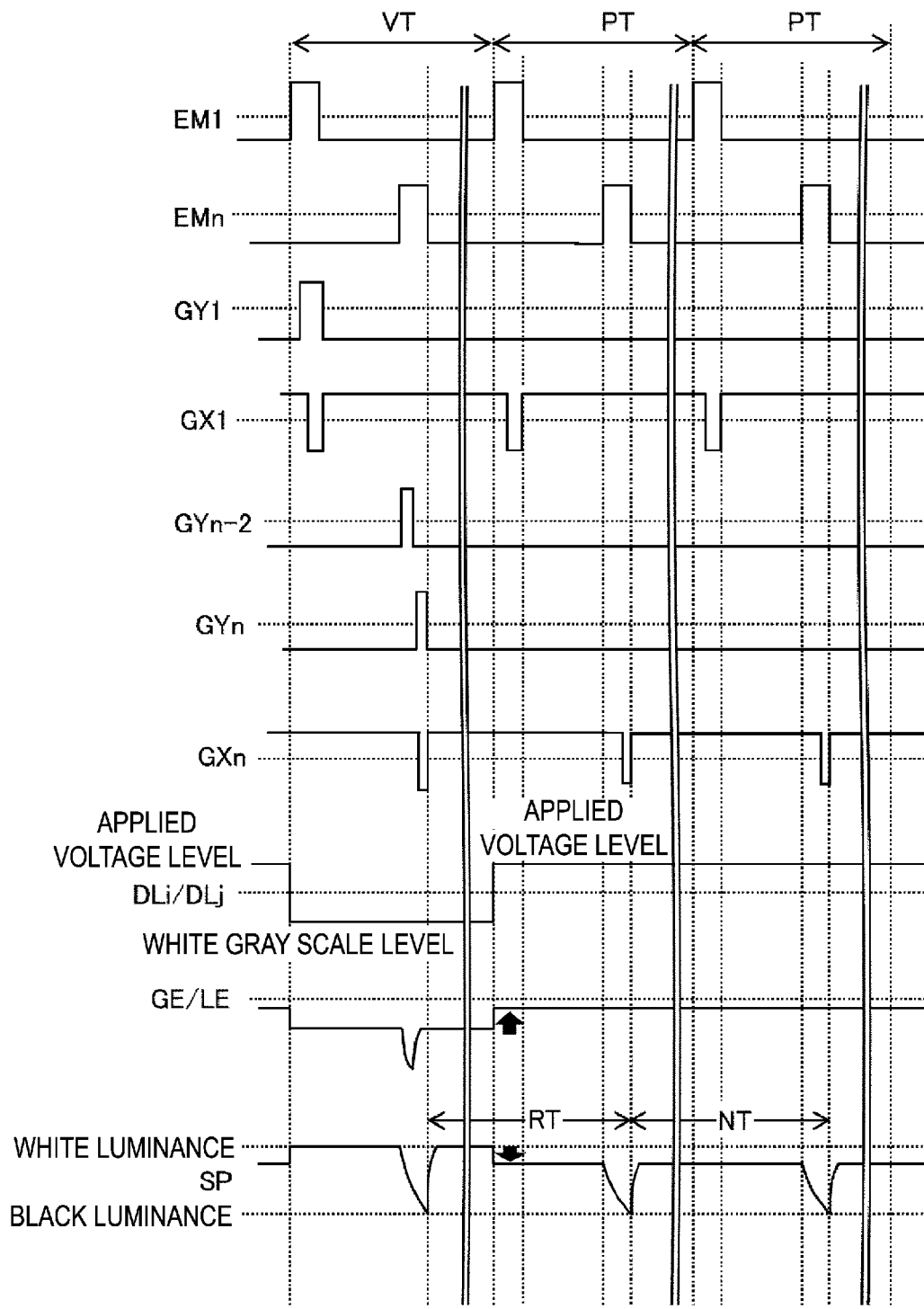
FIG. 6 is a timing chart illustrating actions of a display device according to Reference Example (a case of providing no shield electrode).

As illustrated in FIG. 6, in Reference Example in which no shield electrode A1 is provided, the potential of the conductor LE (and the gate electrode GE) is boosted at the timing of switching between the vertical scanning period VT and the update pause period PT (the timing at which the potential of the data signal line DLi shifts from the white gray scale level to the applied voltage level). Thus, the luminance difference between the refresh frame period RT and the non-refresh frame period NT in the subpixel SP becomes large, so that the low-frequency flicker may be visually recognized.

In the first embodiment, the shield electrode A1 is included in the first metal layer K1, so that it is less likely to be short-circuited with the data signal line DLi included in the fourth metal layer K4 and the conductor LE included in the second metal layer K2.

In addition, the scanning signal line GXn is selected (the transistor T3 is turned on) and a bias (applied voltage level) is applied to the source electrode of the transistor T4 also in the update pause period PT, and thus the luminance difference between the refresh frame period RT and the non-refresh frame period NT is further suppressed. The constant potential signal (applied voltage level) in the update pause period PT only need be set to a predetermined level from the white gray scale level to the black gray scale level.

FIG. 5 illustrates low-frequency driving (refresh frequency 20 Hz) in which one vertical scanning period is followed by one update pause period PT, but this is merely an example, and low-frequency driving (refresh frequency 30 Hz) in which one vertical scanning period is followed by one update pause period PT may be employed, or low-frequency driving (refresh frequency 10 Hz) in which one vertical scanning period is followed by five update pause periods PT may be employed.

Second Embodiment

Figure 7:
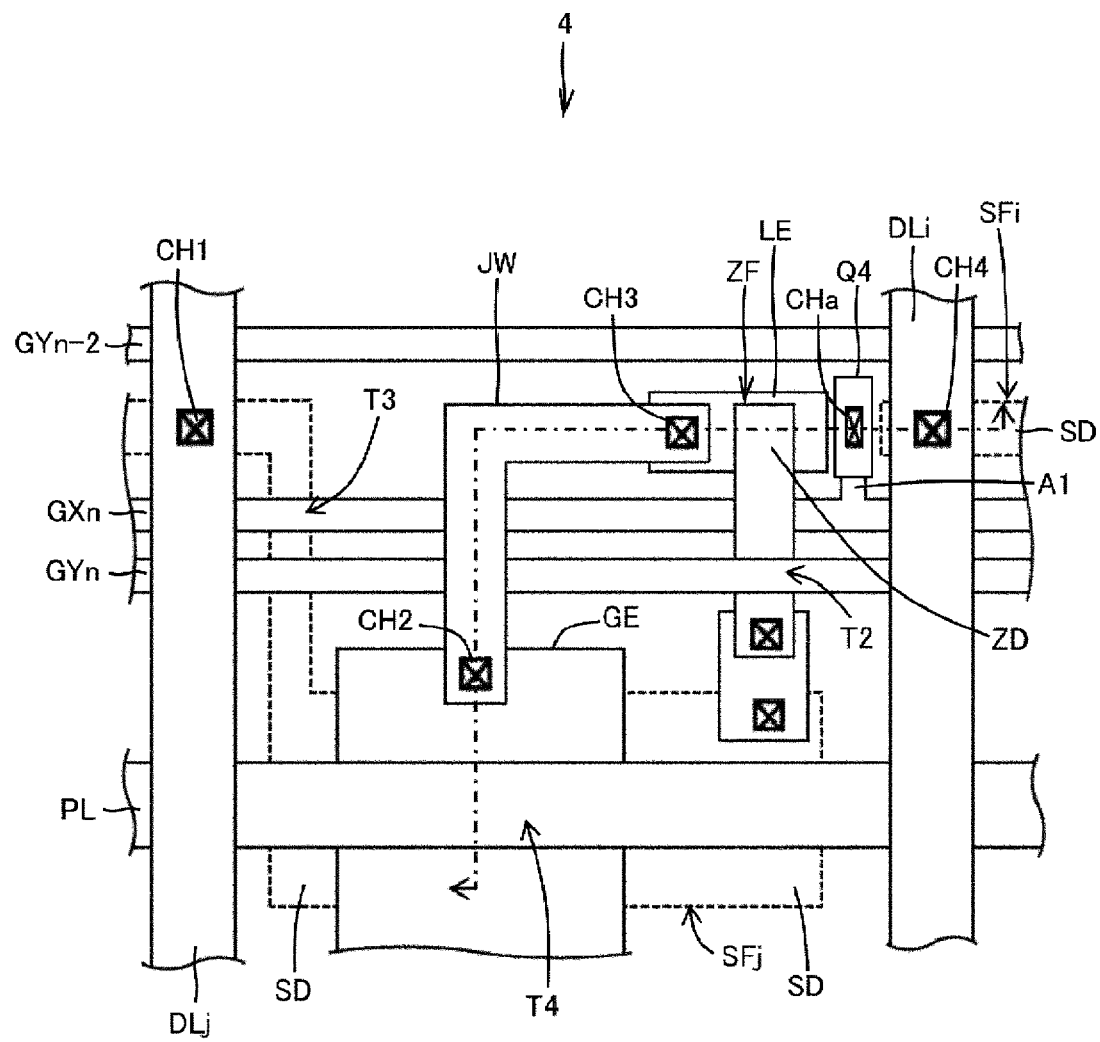
FIG. 7 is a plan view illustrating a configuration of a TFT layer according to a second embodiment.
Figure 8:
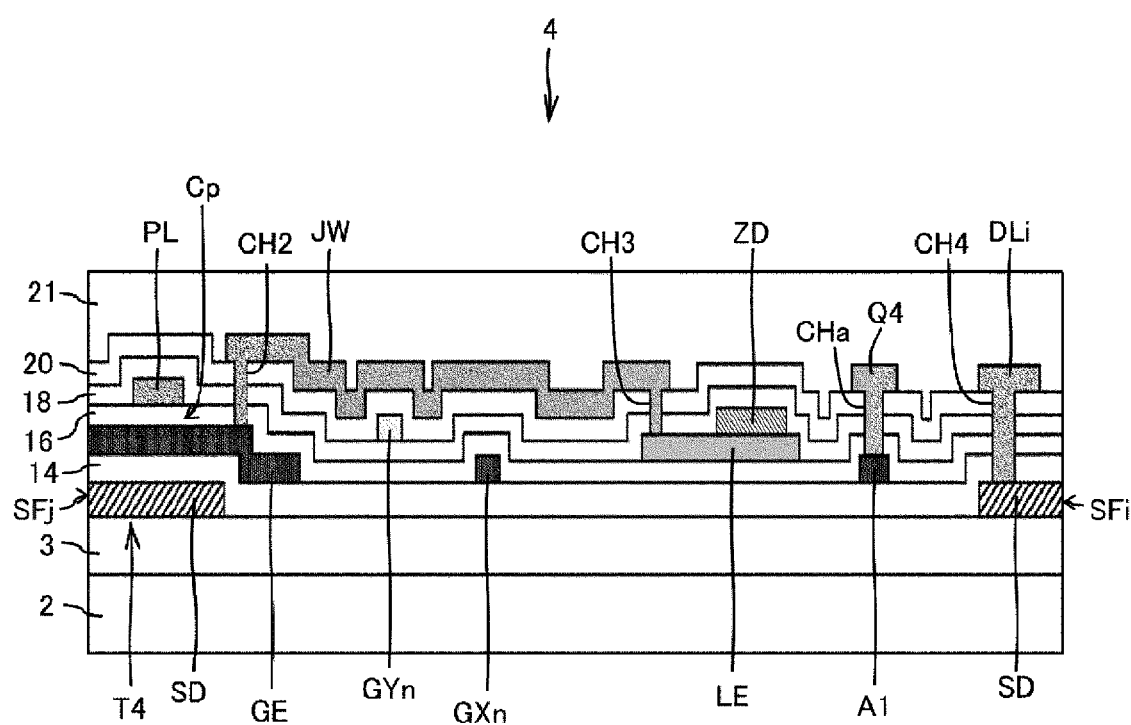
FIG. 8 is a cross-sectional view taken along an arrow in FIG. 7.

FIG. 7 is a plan view illustrating a configuration of a TFT layer according to a second embodiment. FIG. 8 is a cross-sectional view taken along an arrow in FIG. 7. In the second embodiment, an island-shaped electrode Q4 included in the fourth metal layer K4 and overlapping with the shield electrode A1 of the first metal layer K1 is provided, and the shield electrode A1 and the island-shaped electrode Q4 are connected to each other through a contact hole CHa penetrating the inorganic insulating films 16, 18, and 20. This suppresses electrical field formation between the data signal line DLi and the conductor LE more effectively.

Third Embodiment

Figure 9:
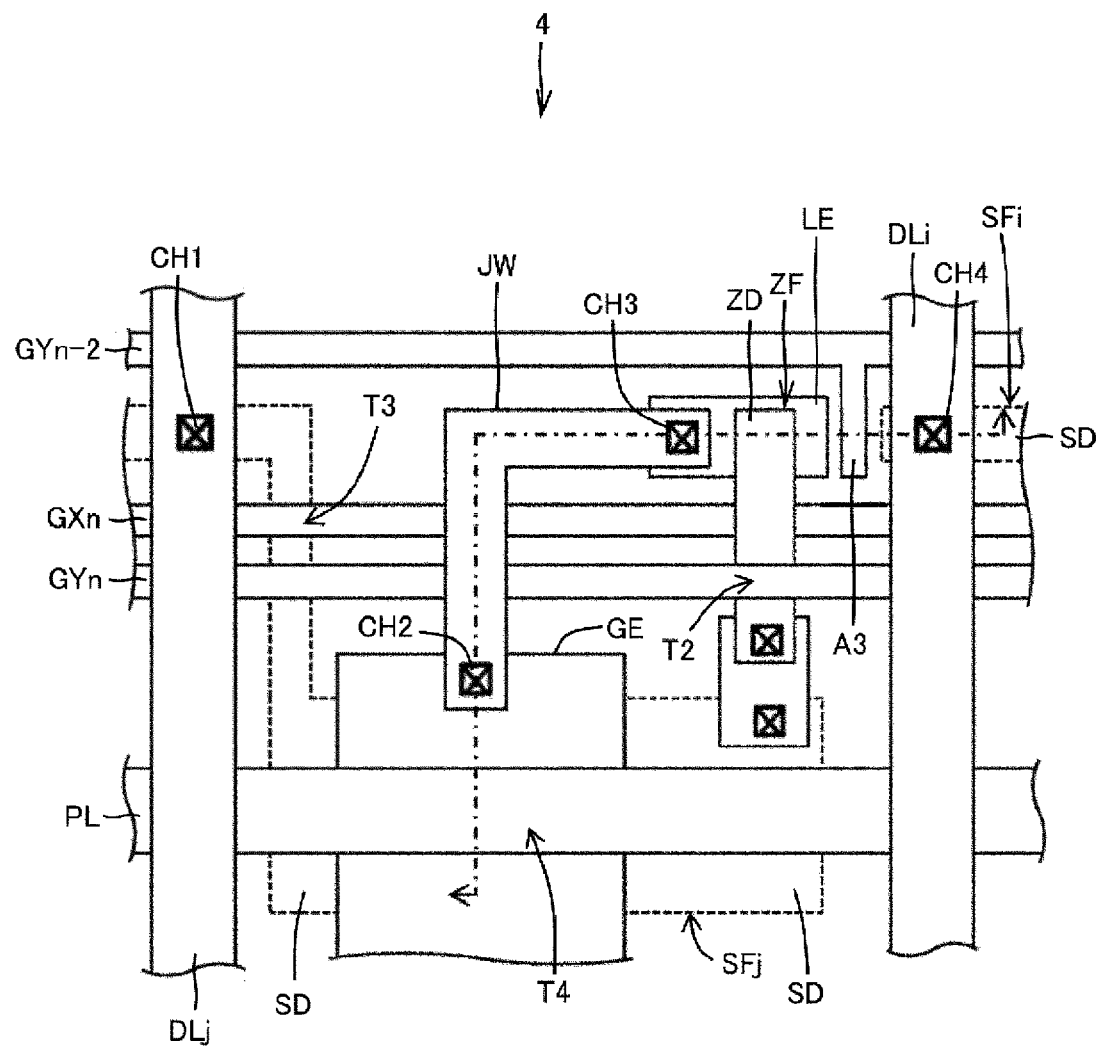
FIG. 9 is a plan view illustrating a configuration of a TFT layer according to a third embodiment.
Figure 10:
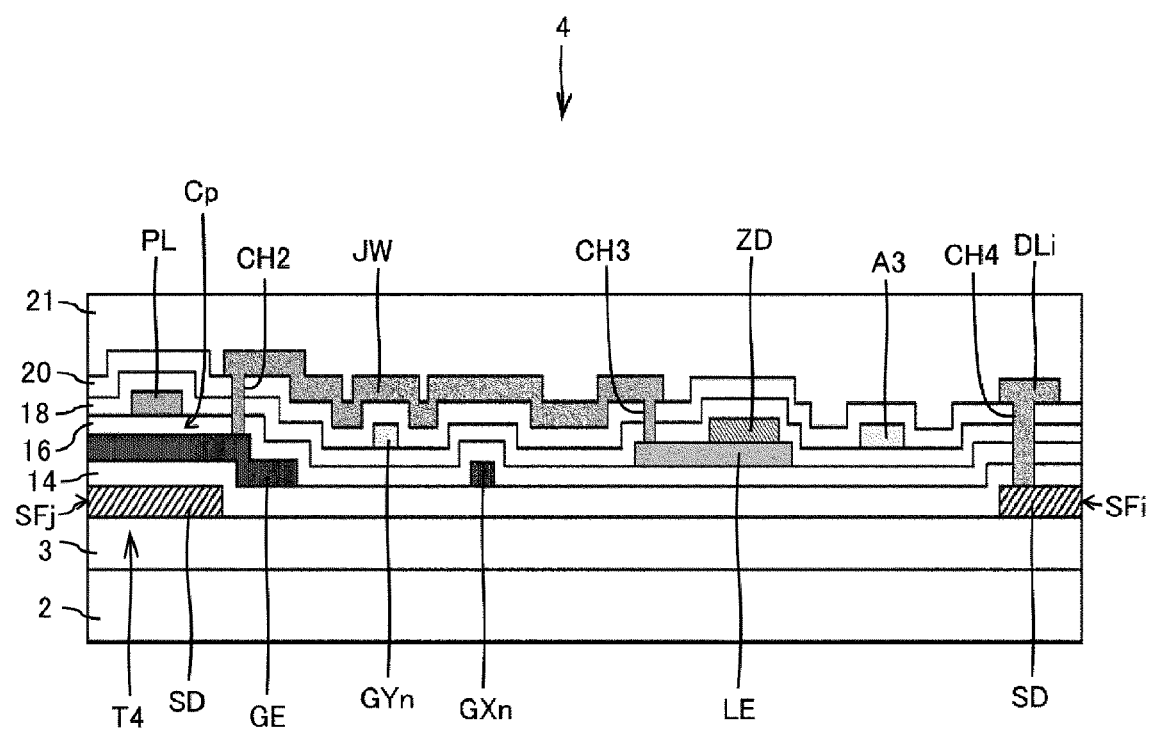
FIG. 10 is a cross-sectional view taken along an arrow in FIG. 9.

FIG. 9 is a plan view illustrating a configuration of a TFT layer according to a third embodiment. FIG. 10 is a cross-sectional view taken along an arrow in FIG. 9. Although the shield electrode A1 is extended from the scanning signal line GXn in the first and second embodiments, this is not a limitation. As in the third embodiment, a shield electrode A3 may be provided to extend from the scanning signal line GYn-2 (scanning signal line for controlling the transistor T1 in the current stage and the transistor T2 in the second preceding stage, see FIG. 2) included in the third metal layer K3 to between the data signal line DLi and the conductor LE in a plan view.

In the third embodiment, the shield electrode A3 is included in the third metal layer K3, so that it is less likely to be short-circuited with the data signal line DLi included in the fourth metal layer K4 and the conductor LE included in the second metal layer K2.

The embodiments described above are for the purpose of illustration and description and are not intended to be limiting. It will be apparent to those skilled in the art that many variations will be possible in accordance with these examples and descriptions.

SUPPLEMENT

First Aspect
A display device including:
a light-emitting element;
a first data signal line to which a signal corresponding to video data is supplied in a vertical scanning period and a signal not corresponding to video data is supplied in an update pause period;
a drive transistor configured to control a current value of the light-emitting element;
a conductor electrically connected to a gate electrode of the drive transistor; and
a shield electrode located between the first data signal line and the conductor and adjacent to each of the first data signal line and the conductor in a plan view.

Second Aspect
The display device according to, for example, the first aspect,
wherein the shield electrode configured to suppress electrical field formation between the first data signal line and the conductor.

Third Aspect
The display device according to, for example, the first or second aspect, further including:
a silicon film;
a first metal layer at an upper layer compared to the silicon film;
a second metal layer at an upper layer compared to the first metal layer;
an oxide semiconductor film at an upper layer compared to the second metal layer;
a third metal layer at an upper layer compared to the oxide semiconductor film; and a fourth metal layer at an upper layer compared to the third metal layer.

Fourth Aspect
The display device according to, for example, the third aspect,
wherein the gate electrode of the drive transistor is included in the first metal layer,
the first data signal line is included in the fourth metal layer, and
the conductor is included in the second metal layer.

Fifth Aspect
The display device according to, for example, the fourth aspect,
wherein the shield electrode is included in the first metal layer or the third metal layer.

Sixth Aspect
The display device according to, for example, the fourth aspect,
wherein the first data signal line and a conductor portion of the silicon film are connected to each other through a contact hole, and
the shield electrode is located between the contact hole and the conductor in a plan view.

Seventh Aspect
The display device according to, for example, the fourth aspect,
wherein a conductor portion of the oxide semiconductor film is provided to be in contact with the conductor.

Eighth Aspect
The display device according to, for example, the first aspect,
wherein the signal not corresponding to the video data is a constant potential signal.

Ninth Aspect
The display device according to, for example, the fifth aspect, further including:
a first scanning signal line;
a second data signal line to which a signal corresponding to video data is supplied in the vertical scanning period and a signal not corresponding to video data is supplied in the update pause period; and
a write transistor including a gate electrode connected to the first scanning signal line,
wherein a source electrode of the drive transistor is connected to the second data signal line via the write transistor, and
the first scanning signal line is selected in each of the vertical scanning period and the update pause period.

Tenth Aspect
The display device according to, for example, the fifth aspect,
wherein the first scanning signal line is included in the first metal layer, and
the shield electrode extends from the first scanning signal line.

Eleventh Aspect
The display device according to, for example, the tenth aspect, further including
an island-shaped electrode formed in the fourth metal layer, the island-shaped electrode overlapping with the shield electrode,
wherein the shield electrode and the island-shaped electrode are connected to each other through a contact hole.

Twelfth Aspect
The display device according to, for example, the tenth aspect, further including:
a second scanning signal line; and
a set transistor including a gate electrode connected to the second scanning signal line,
wherein the gate electrode of the drive transistor is connected to a drain electrode of the drive transistor via the set transistor, and
the second scanning signal line is selected in the vertical scanning period but is not selected in the update pause period.

Thirteenth Aspect
The display device according to, for example, the fifth aspect, further including
a third scanning signal line included in the third metal layer,
wherein the shield electrode extends from the third scanning signal line.

The invention claimed is:
1. A display device comprising: a light-emitting element; a first data signal line to which a signal corresponding to video data is supplied in a vertical scanning period and a signal not corresponding to video data is supplied in an update pause period; a drive transistor configured to control a current value of the light-emitting element; a conductor electrically connected to a gate electrode of the drive transistor; a shield electrode located between the first data signal line and the conductor and adjacent to each of the first data signal line and the conductor in a plan view, a silicon film; a first metal layer at an upper layer compared to the silicon film; a second metal layer at an upper layer compared to the first metal layer; an oxide semiconductor film at an upper layer compared to the second metal layer; a third metal layer at an upper layer compared to the oxide semiconductor film; and a fourth metal layer at an upper layer compared to the third metal layer a fourth metal layer at an upper layer compared to the third metal layer;
    a transistor; and
    a set transistor having an electrode directly connected to the gate electrode of the drive transistor, and each of the transistor and the set transistor having a gate electrode directly connected to a corresponding scanning signal line,
    wherein the gate electrode of the drive transistor is connected to a drain electrode of the drive transistor via the set transistor and is connected to an initialization signal line via the transistor, and the shield electrode and the silicon film do not overlap each other in a plan view.

2. The display device according to claim 1, wherein the shield electrode configured to suppress electrical field formation between the first data signal line and the conductor.

3. The display device according to claim 1, wherein the gate electrode of the drive transistor is included in the first metal layer, the first data signal line is included in the fourth metal layer, and the conductor is included in the second metal layer.

4. The display device according to claim 3, wherein the shield electrode is included in the first metal layer or the third metal layer.

5. The display device according to claim 4, further comprising: a first scanning signal line; a second data signal line to which a signal corresponding to video data is supplied in the vertical scanning period and a signal not corresponding to video data is supplied in the update pause period; and a write transistor including a gate electrode connected to the first scanning signal line, wherein a source electrode of the drive transistor is connected to the second data signal line via the write transistor, and the first scanning signal line is selected in each of the vertical scanning period and the update pause period.

6. The display device according to claim 5, wherein the first scanning signal line is included in the first metal layer, and the shield electrode extends from the first scanning signal line.

7. The display device according to claim 6, further comprising an island-shaped electrode formed in the fourth metal layer, the island-shaped electrode overlapping with the shield electrode, wherein the shield electrode and the island-shaped electrode are connected to each other through a contact hole.

8. The display device according to claim 6, further comprising: a second scanning signal line;
    wherein the set transistor include a gate electrode connected to the second scanning signal line, and
        the second scanning signal line is selected in the vertical scanning period but is not selected in the update pause period.

9. The display device according to claim 4, further comprising a third scanning signal line included in the third metal layer, wherein the shield electrode extends from the third scanning signal line.

10. The display device according to claim 3, wherein the first data signal line and a conductor portion of the silicon film are connected to each other through a contact hole, and the shield electrode is located between the contact hole and the conductor in a plan view.

11. The display device according to claim 3, wherein a conductor portion of the oxide semiconductor film is provided to be in contact with the conductor.

12. The display device according to claim 1, wherein the signal not corresponding to the video data is a constant potential signal.

* * * * *